US006756632B1

United States Patent
Chen et al.

(12) 
(10) Patent No.: US 6,756,632 B1
(45) Date of Patent: Jun. 29, 2004

(54) INTEGRATED CIRCUIT WITH A REPROGRAMMABLE NONVOLATILE SWITCH FOR SELECTIVELY CONNECTING A SOURCE FOR A SIGNAL TO A CIRCUIT

(75) Inventors: Bomy Chen, Cupertino, CA (US); Douglas Lee, San Jose, CA (US); Jack Edward Frayer, Boulder Creek, CA (US); Kai Man Yue, Yuen Long N.T. (HK)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/641,609

(22) Filed: Aug. 15, 2003

(51) Int. Cl.[7] ............................................. H01L 29/788
(52) U.S. Cl. ...................... 257/316; 257/315; 257/318; 257/321
(58) Field of Search .................. 257/315, 316, 257/318, 321

(56) References Cited

U.S. PATENT DOCUMENTS 5,029,130 A    7/1991  Yeh 6,252,273 B1 * 6/2001 Salter et al. ................ 257/316

* cited by examiner

*Primary Examiner*—Long Pham
(74) *Attorney, Agent, or Firm*—Gray Cary Ware & Freidenrich LLP

(57) ABSTRACT

A nonvolatile reprogrammable switch for use in a PLD or FPGA has a nonvolatile memory cell connected to the gate of an MOS transistor with the terminals of the MOS transistor connected to the source of the signal and to the circuit. The nonvolatile memory cell is of a split gate type having a floating gate positioned over a first portion of the channel and a control gate positioned over a second portion of the channel with electrons being injected onto the floating gate by hot electron injection mechanism. The nonvolatile memory cell is erased by the action of the electrons from the floating gate being tunneled through Fowler-Nordheim tunneling onto the control gate, which is adjacent to the second region. As a result, no high voltage is ever applied to the second region during program or erase. Thus, the nonvolatile memory cell with the second region can be connected directly to the gate of the MOS transistor, which together therewith forms a nonvolatile reprogrammable switch.

22 Claims, 1 Drawing Sheet

INTEGRATED CIRCUIT WITH A REPROGRAMMABLE NONVOLATILE SWITCH FOR SELECTIVELY CONNECTING A SOURCE FOR A SIGNAL TO A CIRCUIT

TECHNICAL FIELD

The present invention relates to an integrated circuit, such as a Programmable Logic Device (PLD) or a Field Programmable Gate Array (FPGA) where there is a source for a signal and a circuit and a nonvolatile reprogrammable switch for selectively connecting the source to the circuit. The present invention also relates to a simplified nonvolatile reprogrammable switch.

BACKGROUND OF THE INVENTION

PLDs or FPGAs are well-known in the art. Each type of device comprises a source for generating a signal and a circuit with a switch, such as an FET transistor, for selectively connecting the source to the circuit. Thus, the integrated circuit comprising of a PLD or an FPGA can be "configured" to the user's needs. This configuration can be done "on the fly" in which the switch must be reconfigured every time the device is used. Alternatively, the configuration can be "permanent" such as through the use of fuses and the like and the selective connection is made "permanent." Finally, this connection can also be reprogrammable using a nonvolatile memory cell as the storage element for controlling the FET transistor.

Heretofore, a nonvolatile memory cell, such as a cell using a floating gate to store charges in a stack gate configuration or in a split gate configuration is well-known in the art. However, in a typical nonvolatile memory cell, that is based upon a floating gate for storing of charges and with the charges stored on the floating gate controlling the conduction of current flow in a channel, the nonvolatile memory cell has a first region, and a spaced apart second region with a channel therebetween. The floating gate is positioned over and spaced apart from a portion of the channel for controlling the conduction of the charges in the channel. Heretofore, with the exception of the nonvolatile memory cell disclosed in U.S. Pat. No. 5,029,130, which is assigned to the present assignee and whose disclosure is incorporated herein in its entirety by reference, all of the other prior art nonvolatile memory cells require the use of a high voltage applied to one of the first region or the second region for programming, and applied to the other of the first region or the second region for erase. As a result, because high voltage must be applied to both the first region and to the second region during the erase operation and the programming operation, a nonvolatile memory cell used as a part of a reprogrammable nonvolatile memory switch has required the use of another transistor to separate the nonvolatile memory cell from the FET transistor. This addition of another transistor interposed between the nonvolatile memory cell and the FET transistor causes wastage in real estate in the silicon in that if a integrated circuit device has many interconnections requiring many reprogrammable nonvolatile memory switches, many excess transistors need to be used.

In U.S. Pat. No. 5,029,130, a nonvolatile memory cell is disclosed having a first region and a spaced apart second region with a channel therebetween. A floating gate is positioned over and spaced apart from a first portion of a channel which is adjacent to the first region. A control gate is positioned over and spaced apart from a second portion of the channel which is adjacent to the second region. In programming, the first region is supplied with a high positive voltage to attract electrons from the second region which are injected through the mechanism of hot electron injection onto the floating gate. During erase, the control gate is held at a "high" positive potential to attract electrons from the floating gate to Fowler-Nordheim tunnel through the insulation separating the control gate from the floating gate. The first and second regions can be held at ground or at floating.

SUMMARY OF THE INVENTION

An integrated circuit has a source for a signal and a circuit with a reprogrammable nonvolatile switch for selectively connecting the source for the signal to the circuit. The reprogrammable nonvolatile switch comprises a MOS transistor with a first terminal and a spaced apart second terminal and a channel in between the first terminal and the second terminal. A tunneling insulating layer is over the channel with a gate on the tunneling insulating layer and on the channel. The first terminal is connected to the source and the second terminal is connected to the circuit. A nonvolatile memory cell has a first region and a spaced apart second region with a channel therebetween. A first insulating layer is over the channel. A floating gate is on the first insulating layer and is spaced apart from a first portion of the channel. The first portion of the channel is adjacent to the first region. A control gate is on the first insulating layer and is spaced apart from a second portion of the channel. The second portion of the channel is adjacent to the second region. A second insulating layer is between the floating gate and the control gate. The gate of the MOS transistor is connected to the second region of the nonvolatile memory cell. The first insulating layer permits the injection of charges from the channel onto the floating gate. The second insulating layer permits the Fowler-Nordheim tunneling of electrons between the floating gate and the control gate.

DETAILED DESCRIPTION OF THE INVENTION

Figures 1, 2A, 2B:
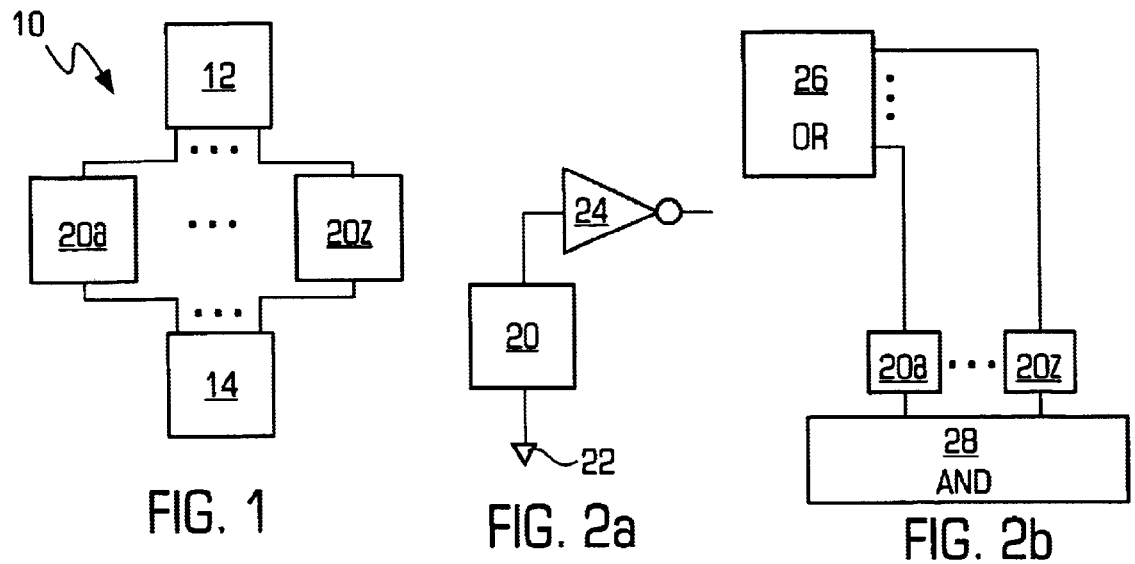
FIG. 1 is a block level diagram of an integrated circuit of the present invention showing a source for a signal and a circuit with a plurality of reprogrammable nonvolatile switches for selectively connecting the source to the circuit.
FIG. 2A is a circuit diagram of a detailed example of one use of the reprogrammable nonvolatile switch of the present invention for connecting a voltage source such as ground to a logic circuit, such as an inverter.
FIG. 2B is a detailed circuit diagram showing the use of the reprogrammable nonvolatile switch of the present invention for use in connecting a plane of OR gates to a plane of AND gates wherein the output of the OR gates is a plurality of logic signals with the array of AND gates selectively connected to the output signals from the array of OR gates.

Referring to FIG. 1 there is shown a block level diagram of an integrated circuit 10 of the present invention. The integrated circuit 10 comprises a source 12 for a signal. As will be shown, as discussed hereinafter, the source 12 can be a voltage source such as ground or $V_{SS}$ or $V_{DD}$ or it can be a source of a logic signal or even an analog signal. As shown in FIG. 1, the source 12 generates a plurality of signals. The integrated circuit 10 also comprises a circuit 14. Again, as will be shown, the integrated circuit 14 can comprise any type of circuit element, such as logic circuit or analog circuit, to process each of the signals from the source 12. Finally, the integrated circuit 10 comprises a plurality of reprogrammable nonvolatile switches 20(a–z). Each reprogrammable nonvolatile switches 20(a–z) selectively connects one of the signals from the source 12 to the circuit 14.

Referring to FIG. 2A there is shown a circuit diagram of one example of the usage of the reprogrammable nonvolatile switch 20 of the present invention for use in an integrated circuit. The reprogrammable nonvolatile switch 20 connects ground voltage or $V_{SS}$ (it could also be $V_{DD}$ or any other voltage) to an inverter circuit 24. As can be seen, if the switch 20 connects the input of the inverter 24 to ground voltage 22, then the output of the inverter 24 is a high voltage. On the other hand, if the switch 20 were in an open position not connecting the input of the inverter 24 to ground 22, then the output of the inverter 24 is an indeterminate or floating signal.

Referring to FIG. 2B there is shown another example of the usage of the reprogrammable nonvolatile switch 20 of the present invention. In this case, the integrated circuit is a PLD which comprises of a plane of OR gates 26 which has a plurality of outputs, each of which is connected to the switch 20 and to the input of a plane of AND gates 28. If a switch 20 were open, then there is no connection between the output of the particular OR gate 26 to the input of the particular AND gate 28. However, if the switch 20 were closed, then the output of the particular OR gate 26 would connect to the input of the particular AND gate 28. Since there is an array of OR gates 26 and an array of AND gates 28, a plurality of switches 20(a–z) are shown.

Further, the switch 20 of the present invention can interconnect different circuits within an FPGA integrated circuit, or any other integrated circuit in which a signal from one portion of the integrated circuit can be selectively connected and reprogrammed to another portion of the circuit in the integrated circuit.

Figure 3A:
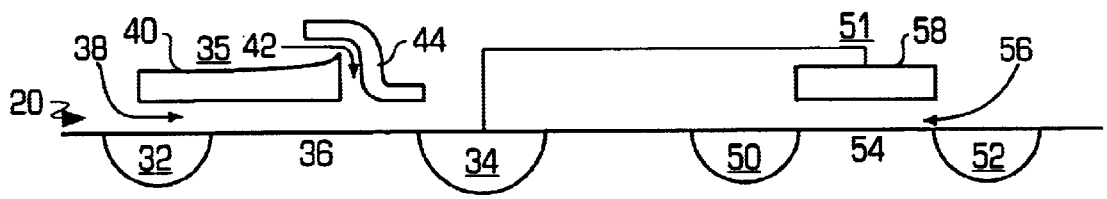
FIG. 3A is a cross-sectional view of one embodiment of the reprogrammable nonvolatile switch of the present invention.

Referring to FIG. 3A there is shown a cross-sectional view of one embodiment of the reprogrammable nonvolatile switch 20 of the present invention. The switch 20 is a part of an integrated circuit, similar to that shown and described in FIGS. 1, 2A and 2B. Thus, there is a substrate 30 of a semiconductive material. However, as is well-known to those skilled in the art, the term "substrate" can also include a well within a substrate. Typically, the substrate 30 is a P type material, although it can also be N type. The switch 20 comprises a nonvolatile memory cell 35 of the type shown and described in U.S. Pat. No. 5,029,130, which as previously discussed, whose disclosure is incorporated herein by reference in its entirety. The cell 35 has a first region 32 separated from a second region 34, with a channel region 36 therebetween, all in the substrate 30. In the preferred embodiment, if the substrate is P type conductivity, then the first and second regions 32 and 34 are of N type. As a result, the channel 36 is of P type. A first insulating layer 38 is over the channel 36. A floating gate 40 is on the first insulating layer 38 and is over a first portion of the channel 36. The first portion of the channel 36 is adjacent to the first region 32. A control gate 44 is on the first layer 38 and is over a second portion of the channel 36. The second portion of the channel 36 is adjacent to the second region 34. The control gate 44 is separated and spaced apart from the floating gate 40 by a second insulating layer 42. As disclosed in U.S. Pat. No. 5,029,130, the mechanism for programming, erasure and reading is as follows.

To program the cell 35, a positive high voltage such as +12 volts is applied to the first region 32. The second region 34 is held substantially at or near ground. The floating gate 40 is capacitively coupled to the first region 32. If +12 volts is applied to the first region 32, then the floating gate 40 would have approximately +8 volts thereon. A low voltage of approximately +2 volts is applied to the control gate 44, thereby turning on the second portion of the channel 36 beneath the control gate 44. As a result, electrons from the second region 34 are accelerated towards the first region 32. However, at a junction between the second portion of the channel 36 and the first portion of the channel 36, the electrons experience an increase in voltage attraction to the floating gate 40 and are injected through the hot electron injection mechanism onto the floating gate 40. Therefore, when the cell 35 is programmed, electrons are injected on the floating gate 40 and the presence of the electrons on the floating gate 40 affect the conduction of electrons in the channel 36. To erase the cell 35, a high potential such as +12 volts is applied to the control gate 44. The first and second regions 32 and 34 can be held at ground or floating. Electrons from the floating gate 40 are attracted by the high positive potential at the control gate 44 and through the mechanism of Fowler-Nordheim tunneling, they tunnel through the second insulating layer 42 separating the control gate 44 from the floating gate 40. To read the cell 35, a positive voltage such as $V_{DD}$ is placed at the first region 32 and $V_{SS}$ is at the second region 34, with a positive voltage placed on the control gate 44. If the floating gate 40 is erased, then it is positively charged and therefore the channel 36 between the first and second regions 32 and 34 would conduct. However, if the floating gate 40 is programmed, and since it is negatively charged, the first portion of the channel 36 would not conduct and there would not be any current flow between the first and second regions 32 and 34.

Figure 3B:
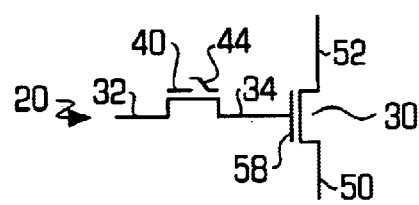
FIG. 3B is a circuit diagram of the structure shown in FIG. 3A.

The reprogrammable nonvolatile switch also comprises a MOS transistor 51. In the preferred embodiment, the MOS transistor 51 is of N type and therefore is a NMOS FET 51. The NMOS FET 51 comprises a first region 50 and a second region 52 (both of N conductivity type) with a channel 54 therebetween. The first region 50, the second region 52 and the channel 54 are in the substrate 30. Above the channel 54 is a tunneling insulating layer 56. Typically, the insulating layer 56 is approximately 20 angstroms thick or less. A gate 58, such as polysilicon, is positioned on the tunneling insulating layer 56 and is above the channel 54 and serves to control the conduction of charges between the first and second regions 50 and 52. Finally, the gate 58 of the NMOS transistor 51 is connected to the second region 34 of the cell 35. Schematically, the reprogrammable nonvolatile switch 20 is shown in FIG. 3B.

In the operation of the reprogrammable nonvolatile switch 20, to program the switch 20, the first and second regions 50 and 52 of the MOS transistor 51 are connected to ground. Electrons tunnel through the tunneling insulating layer 56 onto the gate 58 of the NMOS transistor 51. Electrons then traverse to the second region 34. A positive voltage such as +12 volts is supplied to the first region 32 of the cell 35. A positive voltage such as +2 volts is supplied to the control gate 44. With the second region 34 at substantially ground, electrons from the second region 34 are accelerated to the first region 32 and through the mechanism of hot electron injection are injected onto the floating gate 40. An alternative mechanism to programming the cell 35 can occur by having the substrate 30 tied to ground during programming. In that event, electrons from the substrate 30 are tunneled through the tunneling insulating layer 56 onto the gate 58 of the MOS transistor 51. The electrons will then flow to the second region 34 and be programmed onto the floating gate 40 all as previously described.

The reprogrammable nonvolatile switch 20 is erased by placing a high voltage such as +12 volts to the control gate 44 and with the first and second regions 32 and 34 either floating or tied to ground. Electrons from the floating gate 40 are attracted to the control gate 44 and through the mechanism of Fowler-Nordheim tunneling, they are removed from the floating gate 40 and the floating gate 40 becomes positively charged.

To operate the nonvolatile switch 20, once it has been programmed or erased, an operating voltage such as +3.3 volts is supplied to the first region 32 of the cell 35. A positive voltage such as +2 volts is supplied to the control gate 44. If the floating gate 40 is erased, then the voltage +3.3 volts supplied to the first region 32 passes through the channel 36 onto the second region 34 where that voltage is supplied to the gate 58. Since the MOS transistor 51 is an NMOS FET, the MOS transistor 51 is turned on by a positive voltage such as +3.3 volts. This then causes the signal from the source 12 to be supplied to the circuit 14. However, if the floating gate 40 of the cell 35 is programmed, then the electrons on the floating gate 40 would inhibit the flow of current in the channel 36 between the first region 32 and the second region 34 of the cell 35. The second region 34 would be floating, and eventually reach ground. This would cause the MOS transistor 51 to turn off and not conduct between the first and second regions 50 and 52. This would disconnect the source 12 from the circuit 14.

Figure 4:
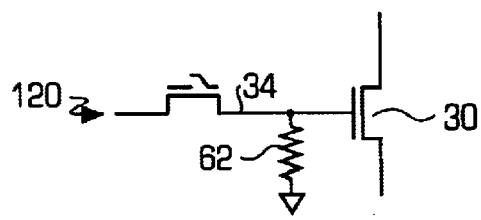
FIG. 4 is a circuit diagram of a second embodiment of the reprogrammable nonvolatile switch of the present invention.

Referring to FIG. 4 there is shown a second embodiment of the reprogrammable nonvolatile switch 120 of the present invention. The switch 120 comprises a nonvolatile memory cell 35 and a NMOS FET 51 of the type shown and described in FIG. 3A, all connected as in accordance with FIG. 3A. In addition, the switch 120 further comprises a polysilicon resistor 62 with one end connected to a voltage source, and the other end connected to the second region 34 of the cell 35. In this embodiment, the voltage source is $V_{SS}$ or ground.

In operation, during programming, electrons would flow from ground through the resistor 62 to the second region 34 and be injected onto the floating gate 35. Thus, the NMOS transistor 51 need not have the critical "thinness" of the tunneling insulating layer 56 to permit electrons to tunnel therethrough. The erase mechanism for the switch 120 is the same as that described for the switch 20 shown in FIGS. 3A and 3B. Finally, in read operation, a positive voltage such as +3.3 volts is applied to the first region 32. If the floating gate 40 is erased, then the +3.3 volts is passed through the channel 36 onto the second region 34 and supplied to the gate 58 of the NMOS transistor 51 thereby turning on the transistor 51 to connect the source 12 to the circuit 14. With the resistor 62 at a relatively high resistance, such as 0.1 giga ohm to 10 giga ohm, current flow through the resistor 62 to ground or $V_{SS}$, can be minimized. If the floating gate 40 were programmed, then the channel 36 would not conduct and the +3.3 volts supplied to the first region 32 would not be transferred to the second region 34. In that event, the ground voltage or $V_{SS}$ voltage from the one terminal of the resistor 62 would then be supplied to the second region 34 and to the gate 58 of the NMOS transistor 51 thereby turning off the NMOS transistor 51. In this embodiment, the reprogrammable nonvolatile switch 120 clearly is "faster" in switching off the NMOS transistor 51 than the embodiment shown and described in FIGS. 3A and 3B in that in the "off" state, the switch 120 does not have to wait for the second region 34 to migrate from a float condition to ground, thereby turning off the NMOS transistor 51.

Since the cell 35 is programmed by the electrons from the ground voltage source at the one end of the resistor 62, and do not tunnel through the FET transistor 51, the FET transistor 51 can be either NMOS or PMOS type.

Alternatively, the one end of the resistor 62 can be connected to $V_{DD}$. In that event, during programming, electrons tunnel through the tunneling insulating layer 56, from the first and second terminals 50 and 52 connected to ground (or the substrate 30 connected to ground) as previously discussed. The mechanism of erase is the same as previously described for the embodiments shown and described in FIGS. 3A and 3B. Finally, to read, a zero voltage is supplied to the first region 32. If the cell 35 were erased, i.e. the floating gate 40 is positively charged, then the zero volt applied to the first region 32 is passed through the cell 35 and is applied to the gate 58, which turns off the NMOS FET transistor 51. If the cell 35 were programmed, then the zero volt applied to the first region 32 would not pass through the channel 36. In that event, the voltage $V_{DD}$ from the one end of the resistor 62 would be applied to the gate 58, turning on the NMOS FET transistor 51.

Figure 5:
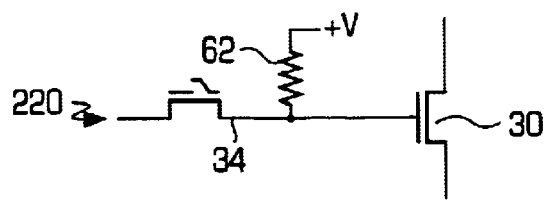
FIG. 5 is a circuit diagram of a third embodiment of the reprogrammable nonvolatile switch of the present invention.

The foregoing description for the switch 20 and 120 have been of the cell 35 and the MOS transistor 51 being of the N type, i.e., the substrate 30 is of P conductivity with the regions 32, 34, 50 and 52 being of N conductivity. In that event, the charges that would tunnel through the tunneling insulating layer 56 from the first and second regions 50 and 52 or through the substrate 30 onto the gate 58 and into the second region 34 and to the floating gate 40 are electrons. Alternatively, the switch 20 or 120 can be manufactured with complementary charges, i.e., holes traversing the channel 36. Referring to FIG. 5, there is shown a third embodiment of a reprogrammable nonvolatile switch 220 using P type devices and holes. In this embodiment, the substrate 30 is of the N conductivity type, and the first region 32, second region 34 of the cell 35 are of the P conductivity type. The first terminal 50 and the second terminal 52 of the MOS transistor 51 are also of P type, thereby making the transistor 51 of a PMOS type. A polysilicon resistor 62 connects between the second region 34 and a voltage source. In the embodiment shown in FIG. 5, the voltage source is a positive voltage source. To program the switch 220, the first region 32 is connected to a source of negative voltage such as −12 volts. Holes from the one end of the resistor 62 through the positive voltage source, traverse through the resistor 62 into the second region 34 where they are attracted to the negative voltage applied to the first region 32. They accelerate through the channel 36 and are injected onto the floating gate 40. To erase the cell 35, the control gate 44 is connected to a source of negative voltage and electrons from the control gate 44 tunnel through the second insulating layer 42 onto the floating gate 40 to "neutralize" the holes.

In operation, a low positive voltage or ground, such as $V_{SS}$ is supplied to the first region 32. If the floating gate 40 were positively charged, i.e., through holes being injected through the first insulating layer 38 onto the floating gate 40, then because this is a P type device, the voltage at the first region 32 would not pass through the channel 36 onto the second region 34. In that event, the voltage source from the one end of the resistor 62 is supplied to the gate 58 of the PMOS transistor 51 thereby turning off the PMOS transistor 51. If the floating gate 40 were erased, i.e., with electrons on the floating gate 40, then the channel 36 would be conducting. In that event, ground or $V_{SS}$ would pass through the channel 36 to the second region 34 and be supplied to the gate 58 of the PMOS transistor 51 thereby turning on the transistor 51 connecting the source 12 to the circuit 14.

Since the cell 35 is programmed by the holes from the positive voltage source at the one end of the resistor 62, and do not tunnel through the FET transistor 51, the FET transistor 51 can be either NMOS or PMOS type.

Alternatively, the one end of the resistor 62 can be connected to $V_{SS}$. In that event, during programming, holes tunnel through the tunneling insulating layer 56 from the first and second terminals 50 and 52 connected to a positive voltage (or the substrate 30 connected to a positive voltage) as previously discussed. The mechanism of erase is the same as previously described. Finally, to read, a positive voltage, such as +3.3 volts is supplied to the first region 32. If the floating gate 40 is positively charged, then the +3.3 volts applied to the first region 32 is not passed through the cell 35. In that event the ground or $V_{SS}$ voltage from the one end of the resistor 62 is applied to the second region 34 and the gate 58. Since the FET transistor 51 is of P type, a ground volt applied to the gate 58 would turn on the transistor 51. If the floating gate 40 is negatively charged, then the +3.3 volt applied to the first region 32 would pass through the channel 36. In that event, the positive volt on the gate 58 would turn off the PMOS FET transistor 51.

As can be seen, the principles of operation for the switch 220 is the same as that for the switch 20 or 120, except the charges of the electrons for the switch 20 and 120 are replaced by holes.

What is claimed is:

1. An integrated circuit comprising:
   a source for a signal;
   a circuit;
   a reprogrammable non-volatile switch for selectively connecting said source to said circuit, said switch comprising:
   a MOS transistor having a first terminal and a spaced apart second terminal with a channel between said first terminal and said second terminal; a tunneling insulating layer over said channel, and a gate on said tunneling insulating layer and on said channel; said first terminal is connected to said source, and said second terminal is connected to said circuit;
   a non-volatile memory cell having a first region and a spaced apart second region with a channel therebetween, a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of charges from said channel onto said floating gate, and said second insulating layer permits the Fowler-Nordheim tunneling of electrons between said floating gate and said control gate;
   said gate of said MOS transistor connected to said second region of said non-volatile memory cell;
   wherein said MOS transistor is connectable to a first voltage, said control gate is connectable to a second voltage, and said first region is connectable to a third voltage permitting charges to tunnel through said tunneling insulating layer of said MOS transistor to said second region, into said channel of said non-volatile memory cell, and being injected onto said floating gate for programming;
   wherein said control gate is connectable to a fourth voltage for removal of charges from said floating gate; and
   wherein said first region is connectable to a fifth voltage to control the connection of said source to said circuit depending upon the state of said floating gate.

2. The integrated circuit of claim 1 wherein said charges are holes.

3. The integrated circuit of claim 1 wherein said charges are electrons.

4. The integrated circuit of claim 3 wherein said source for a signal is a voltage source.

5. The integrated circuit of claim 3 wherein said source for a signal is a first circuit, and wherein said circuit is a second circuit.

6. The integrated circuit of claim 5 wherein said first circuit is a first logic circuit, and wherein said second circuit is a second logic circuit.

7. The integrated circuit of claim 5 wherein said integrated circuit is a FPGA.

8. The integrated circuit of claim 3 further comprising:
   a resistor connecting said second region of said non-volatile memory cell to a voltage source.

9. The integrated circuit of claim 8 wherein said resistor is a polysilicon resistor.

10. The integrated circuit of claim 3 wherein said first voltage is ground.

11. The integrated circuit of claim 10 wherein said first and second terminals of said MOS transistor are connected to ground.

12. The integrated circuit of claim 10 wherein said MOS transistor has a substrate and wherein said substrate is connected to ground.

13. The integrated circuit of claim 3 wherein said first region of said non-volatile memory cell is capacitively coupled to said floating gate, and wherein said third voltage is a positive voltage sufficient to cause said electrons in said channel of said non-volatile memory cell to be injected onto said floating gate.

14. The integrated circuit of claim 3 wherein said MOS transistor is a PMOS FET.

15. The integrated circuit of claim 3 wherein said MOS transistor is a NMOS FET.

16. An integrated circuit comprising:
   a source for a signal;
   a circuit;
   a reprogrammable non-volatile switch for selectively connecting said source to said circuit, said switch comprising:
   a switching transistor having a first terminal, a spaced apart second terminal, and a gate for controlling the flow of current between said first terminal and said second terminal; said first terminal is connected to said source, and said second terminal is connected to said circuit;
   a non-volatile memory cell having a first region and a spaced apart second region with a channel therebetween, a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of hot electrons from said channel onto said floating gate, and said second insulating layer permits the Fowler-Nordheim tunneling of electrons from said floating gate to said control gate;

said gate of said switching transistor connected to said second region of said non-volatile memory cell;

a resistor connecting said second region of said non-volatile memory cell to ground;

wherein said control gate is connectable to a first voltage, and said first region is connectable to a second voltage permitting electrons from ground to pass through said resistor into said channel of said non-volatile memory cell, and being injected onto said floating gate for programming;

wherein said control gate is connectable to a third voltage for removal of electrons from said floating gate; and wherein said first region is connectable to a fourth voltage to control the connection of said source to said circuit depending upon the state of said floating gate.

17. The integrated circuit of claim 16 wherein said source for a signal is a voltage source.

18. The integrated circuit of claim 16 wherein said source for a signal is a first circuit, and wherein said circuit is a second circuit.

19. The integrated circuit of claim 18 wherein said first circuit is a first logic circuit, and wherein said second circuit is a second logic circuit.

20. The integrated circuit of claim 18 wherein said integrated circuit is a FPGA.

21. The integrated circuit of claim 16 wherein said resistor is a polysilicon resistor.

22. The integrated circuit of claim 16 wherein said first region of said non-volatile memory cell is capacitively coupled to said floating gate, and wherein said second voltage is a positive voltage sufficient to cause said electrons in said channel of said non-volatile memory cell to be injected onto said floating gate.

* * * * *